United States Patent
Mueller et al.

(10) Patent No.: US 7,521,862 B2
(45) Date of Patent: Apr. 21, 2009

(54) LIGHT EMITTING DEVICE INCLUDING LUMINESCENT CERAMIC AND LIGHT-SCATTERING MATERIAL

(75) Inventors: Gerd O. Mueller, San Jose, CA (US); Regina B. Mueller-Mach, San Jose, CA (US)

(73) Assignee: Philips Lumileds Lighting Co., LLC, San Jose, CA (US)

( * ) Notice: Subject to any disclaimer, the term of this patent is extended or adjusted under 35 U.S.C. 154(b) by 331 days.

(21) Appl. No.: 11/561,859

(22) Filed: Nov. 20, 2006

(65) Prior Publication Data

US 2008/0116467 A1    May 22, 2008

(51) Int. Cl.
  *H01J 1/62* (2006.01)
(52) U.S. Cl. .................. 313/506; 313/509
(58) Field of Classification Search ................. 313/498, 313/503, 506, 509
  See application file for complete search history.

(56) References Cited

U.S. PATENT DOCUMENTS

| | | | |
|---|---|---|---|
| 5,744,815 A | 4/1998 | Gurevich et al. | |
| 6,335,548 B1 | 1/2002 | Roberts et al. | |
| 6,351,069 B1 | 2/2002 | Lowery et al. | |
| 6,409,938 B1 | 6/2002 | Comanzo | |
| 6,501,100 B1 | 12/2002 | Srivastava et al. | |
| 6,576,488 B2 | 6/2003 | Collins, III et al. | |
| 6,630,691 B1 | 10/2003 | Mueller-Mach et al. | |
| 6,642,618 B2 | 11/2003 | Yagi et al. | |
| 6,650,044 B1 | 11/2003 | Lowery | |
| 6,696,703 B2 | 2/2004 | Mueller-Mach et al. | |
| 6,965,197 B2 * | 11/2005 | Tyan et al. ................. | 313/506 |
| 2004/0007961 A1 | 1/2004 | Srivastava et al. | |
| 2004/0124429 A1 | 7/2004 | Stokes et al. | |
| 2004/0164311 A1 | 8/2004 | Uemura | |
| 2005/0269582 A1 | 12/2005 | Mueller et al. | |

FOREIGN PATENT DOCUMENTS

DE    10349038 A1    5/2004

\* cited by examiner

*Primary Examiner*—Vip Patel
(74) *Attorney, Agent, or Firm*—Patent Law Group

(57) ABSTRACT

A ceramic body comprising a wavelength converting material is disposed in the path of light emitted by the light emitting region of a semiconductor structure comprising a light emitting region disposed between an n-type region and a p-type region. A layer of transparent material is also disposed in the path of light emitted by the light emitting region. The transparent material may connect the ceramic body to the semiconductor structure. Particles configured to scatter light emitted by the light emitting region are disposed in the layer of adhesive material. In some embodiments the particles are phosphor; in some embodiments the particles are not a wavelength-converting material.

22 Claims, 2 Drawing Sheets

LIGHT EMITTING DEVICE INCLUDING LUMINESCENT CERAMIC AND LIGHT-SCATTERING MATERIAL

BACKGROUND

1. Field of Invention

The present invention relates to wavelength-converted semiconductor light emitting devices.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Since the light emitted by III-nitride devices is generally on the shorter wavelength end of the visible spectrum, the light generated by III-nitride devices can be readily converted to produce light having a longer wavelength. It is well known in the art that light having a first peak wavelength (the "primary light") can be converted into light having a longer peak wavelength (the "secondary light") using a process known as luminescence/fluorescence. The fluorescent process involves absorbing the primary light by a wavelength-converting material such as a phosphor and exciting the luminescent centers of the phosphor material, which emit the secondary light. The peak wavelength of the secondary light will depend on the phosphor material. The type of phosphor material can be chosen to yield secondary light having a particular peak wavelength.

Phosphors may be disposed in the path of light emitted by an LED in several ways. U.S. Pat. No. 6,351,069 describes a III-nitride LED die covered by a layer of a transparent resin in which a wavelength-converting material is mixed. U.S. Pat. No. 6,630,691 describes growth of LED devices on single crystal luminescent substrates. U.S. Pat. No. 6,696,703 describes the use of thin film phosphor layers disposed over LEDs. Several patents describe forming conformal phosphor layers on LEDs, for example by electrophoretic deposition as described in U.S. Pat. No. 6,576,488, or by stenciling as described in U.S. Pat. No. 6,650,044. Many of these phosphor layers are fragile and difficult to handle, and are intolerant of the high temperature and high flux environment created by the LED. In addition, it may be difficult or impossible to form multiple phosphor layers by some processes.

An alternative to the above-described phosphor layers is the use of wavelength converting materials formed into ceramic slabs, as described in more detail in U.S. Patent Application Publication 2005-0269582, which is incorporated herein by reference. The luminescent ceramic slabs described therein are generally self-supporting layers formed separately from the semiconductor device, then attached to the finished semiconductor device or used as a growth substrate for the semiconductor device. Luminescent ceramics tend to be more robust than the phosphor layers described above.

SUMMARY

In accordance with embodiments of the invention, a ceramic body comprising a wavelength converting material is disposed in the path of light emitted by the light emitting region of a semiconductor structure comprising a light emitting region disposed between an n-type region and a p-type region. A layer of transparent material is also disposed in the path of light emitted by the light emitting region. The transparent material may connect the ceramic body to the semiconductor structure. Particles configured to scatter light emitted by the light emitting region are disposed in the layer of adhesive material. In some embodiments the particles are phosphor; in some embodiments the particles are not a wavelength-converting material. The presence of scattering particles in the adhesive may improve the uniformity of the appearance of composite light from the device, and may improve the color characteristics of the composite light.

DETAILED DESCRIPTION

Luminescent ceramic layers may be made by heating a conventional powder phosphor under pressure until the surface of the phosphor particles begin to soften and melt. The partially melted particles stick together to form a rigid agglomerate of particles. Unlike a thin film, which optically behaves as a single, large phosphor particle with no optical discontinuities, a luminescent ceramic behaves as tightly packed individual phosphor particles, such that there are small optical discontinuities at the interface between different phosphor particles. Since the powder phosphor starting material is generally of uniform composition and doping, the resulting luminescent ceramic is generally transparent, optically homogenous, and uniformly doped throughout the ceramic slab with activating dopants that act as luminescent centers.

One problem with uniformly doped luminescent ceramics is the minimum thickness of the luminescent ceramic is limited by the ability to reproducibly manufacture the ceramic. Many phosphors have a preferred doping range where the phosphor absorbs and emits light efficiently. In phosphor arrangements such as conformal layers, phosphor powder with the preferred doping level is deposited to whatever thickness is necessary to achieve the desired number of luminescent centers, which produces the desired amount of phosphor conversion and of leakage of unconverted light from the light emitting diode, resulting in the desired characteristics of the composite light. In a luminescent ceramic, the thickness required for manufacturability may force the use of a much lower doping level than the preferred level, if the use of the preferred doping level phosphor powder in a ceramic at the minimum thickness required for manufacturability results in too many luminescent centers, and therefore too much phosphor conversion.

The above described problem of too many luminescent centers is particularly acute for a red-emitting luminescent ceramic combined with a blue light emitting diode and a yellow-emitting luminescent ceramic to make white composite light. Only a small amount of red-emitting phosphor is required to make white composite light; if too much red-emitting phosphor is used, the composite light will appear too red. At the preferred doping level of luminescent centers in a red-emitting phosphor, the desired number of luminescent centers necessary to produce the desired red emission is achieved in a luminescent ceramic layer 20 μm thick. However, the minimum manufacturable thickness of a luminescent ceramic formed from a phosphor is 100 μm. In order to achieve the desired number of luminescent centers in a luminescent ceramic 100 μm thick, a phosphor powder with a much lower, less desirable doping level must be used to form the luminescent ceramic.

Figure 1:
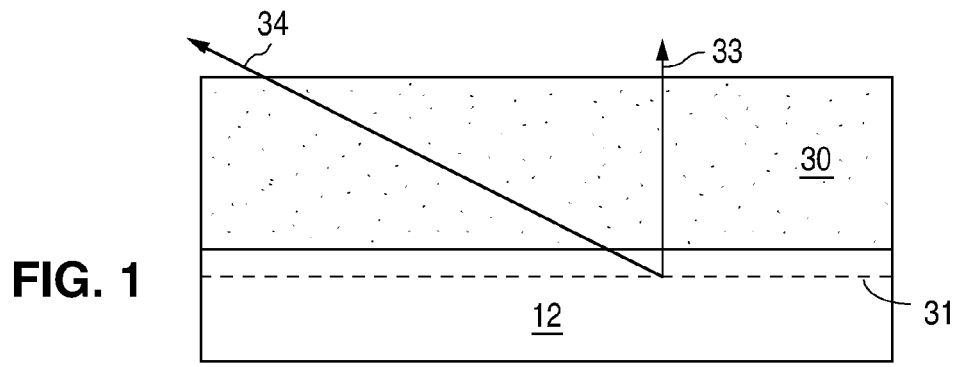
FIG. 1 illustrates a luminescent ceramic disposed over a semiconductor structure including a light emitting layer.

A second problem with transparent luminescent ceramics is illustrated in FIG. 1. A transparent luminescent ceramic 30 is connected to a light emitting device 12. Two light rays 33 and 34 emitted from light emitting region 31 are illustrated. Since light ray 33 is emitted at a smaller angle relative to normal to the surface of the light emitting layer than ray 34, ray 33 "sees" less of the phosphor in luminescent ceramic 30, and is more likely to escape luminescent ceramic 30 without being phosphor-converted. In contrast, ray 34 sees much more of the phosphor in luminescent ceramic 30, and is more likely to be phosphor-converted before escaping luminescent ceramic 30. As a result, assuming that light emitting region 31 emits blue light and the phosphor in luminescent ceramic 30 emits yellow light, light emitted from the top surface near the center of the device appears more blue, while light emitted from the top surface near the edges of the device appears more yellow, resulting in an undesirable yellowish "halo" around a center of more bluish light.

The yellow halo problem illustrated in FIG. 1 may be reduced or eliminated by increasing scattering from luminescent ceramic 30; that is, by making luminescent ceramic 30 translucent rather than transparent, often by incorporating air pockets during manufacture of the ceramic, which air pockets act as scattering centers. One problem with this approach is it is difficult to control the incorporation of air pockets. Incorporation of too many air pockets may result in too much scattering, which can reduce extraction efficiency from luminescent ceramic 30.

Figure 2:
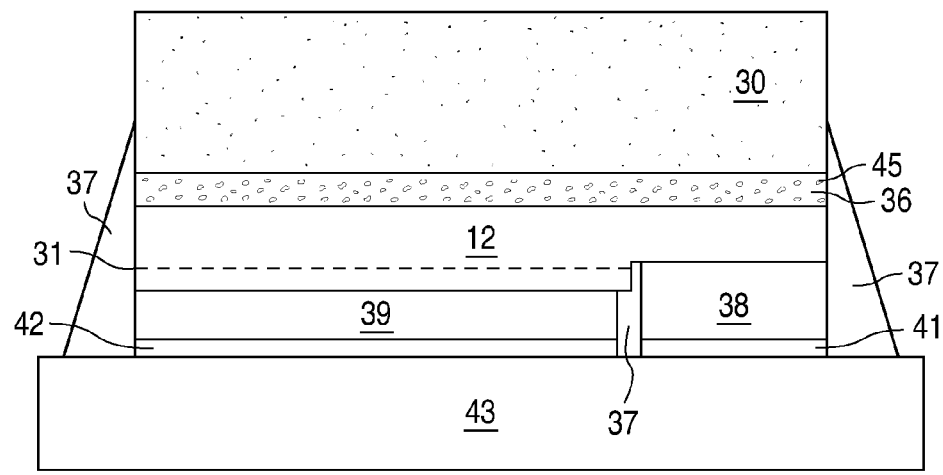
FIG. 2 illustrates a luminescent ceramic attached to a semiconductor structure by a transparent material including scattering particles, according to embodiments of the invention.

In some embodiments of the invention, a material that produces scatter, such as a phosphor, is disposed between a semiconductor light emitting device and a luminescent ceramic, as in the device shown in cross sectional view in FIG. 2. In the device of FIG. 2, a III-nitride semiconductor structure including a light emitting region 31 disposed between an n-type region and a p-type region is grown on a growth substrate (not shown). Portions of the p-type region and light emitting region are etched away to expose a portion of the n-type region. P- and n-contacts 39 and 38, often reflective contacts, are formed on the exposed portions of each of the p-type and n-type regions of the semiconductor structure. Semiconductor structure 12 is electrically and physically connected to a mount 43 via p- and n-interconnects 42 and 41, which may be, for example, solder or gold interconnects.

An underfill material 37 may be injected in any spaces between semiconductor structure 12 and mount 43, before, during, or after the mounting of semiconductor structure 12 on mount 43. Underfill material 37 supports semiconductor structure 12 to prevent or reduce cracking or other damage caused by removing the growth substrate. Underfill material 37 may be formed such that sidewalls 37 extend along and even past the edges of semiconductor structure 12. After the growth substrate is removed, the top surface of semiconductor structure 12, according to the orientation shown in FIG. 2, is exposed. The surface of semiconductor structure 12 may be roughened or otherwise textured to improve light extraction, for example by photoelectrochemical etching.

A luminescent ceramic 30 is attached to the top surface of semiconductor structure 12. A layer of transparent material 36 is disposed between semiconductor structure 12 and luminescent ceramic 30. Though material 36 is described herein as "transparent," it is to be understood that material 36 need not be completely transparent, though in most embodiments it is preferable that material 36 not absorb a significant amount of light. In some embodiments, transparent material 36 acts as an adhesive to attach luminescent ceramic 30 to semiconductor structure 12. Sidewalls 37 of the underfill material may contain the lateral extent of transparent material 36.

Figure 4:
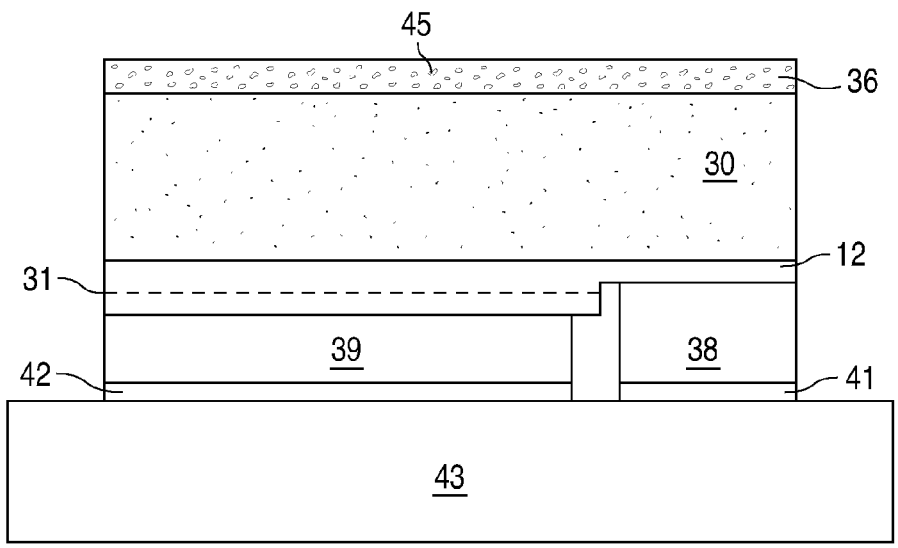
FIG. 4 illustrates a transparent material including scattering particles formed over a luminescent ceramic connected to a semiconductor structure, according to embodiments of the invention.

In some embodiments of the invention, the material that produces scatter is formed over a luminescent ceramic connected to a semiconductor light emitting device, as in the device shown in cross sectional view in FIG. 4. As in FIG. 2, in the device of FIG. 4, a luminescent ceramic is connected, for example, by a transparent adhesive layer such as silicone, epoxy, or sol gel, or by direct wafer bonding, to a III-nitride semiconductor structure mounted on a mount. Transparent material 36 is formed over luminescent ceramic 30. In some embodiments of the invention, a transparent material layer disposed between semiconductor structure 12 and luminescent ceramic 30, as shown in FIG. 2, may be combined with a transparent material layer formed over luminescent ceramic, as shown in FIG. 4.

Disposed within transparent material 36 of FIG. 2 or FIG. 4 are particles 45 that act as scattering centers. Transparent material 36 may be loaded with enough particles 45 to cause sufficient scattering to reduce or eliminate the yellow halo problem described above. Transparent material 36 may have a thickness between, for example, 0.5 and 50 μm, in contrast to luminescent ceramic 30, which generally has a thickness greater than 100 μm. In some embodiments, scattering particles 45 are non-wavelength converting materials. Scattering particles 45 are selected such that the difference in refractive index between transparent material 36 and scattering particles 45 is as large as possible. For example, transparent material 36 may have an index of refraction between 1.4 and 1.5 as is the case with, for example, epoxy or silicone. Scattering particles may have an index of refraction between 1.8 and 2.4, as is the case with, for example, doped or undoped $Y_3Al_5O_{12}$ or ZnS. The smaller the difference in refractive index, the more scattering particles 45 must be disposed in transparent material 36 to achieve a given amount of scattering. Examples of suitable materials for scattering particles 45 include oxides of yttrium such as $Y_2O_3$, oxides of titanium, oxides of strontium, and oxides of rubidium. In some embodiments, suitable particles have an average diameter between 0.5λ and 20λ, where λ is the wavelength within the device of light emitted by the light emitting region. In some embodiments, a suitable volumetric fill factor of particles is between 10 and 50% of the volume of transparent material 36 and a suitable number density of particles is one particle per volume $(5\lambda)^3$. Both particle size and particle number density may depend on the difference in refractive index between transparent material 36 and particles 45.

In some embodiments, scattering particles 45 are phosphor particles such as red-emitting phosphor particles. Suitable red-emitting phosphors include eCAS, BSSNE, SSONE, as well as $(Ca_{1-x}Sr_x)S:Eu^{2+}$ wherein $0<x\leq1$ including, for example, $CaS:Eu^{2+}$ and $SrS:Eu^{2+}$; and $(Sr_{1-x-y}Ba_xCa_y)_{2-z}Si_{5-a}Al_aN_{8-a}O_a:Eu_z^{2+}$ wherein $0\leq a<5$, $0<x\leq1$, $0\leq y\leq1$, and $0<z\leq1$ including, for example, $Sr_2Si_5N_8:Eu^{2+}$. eCAS, which is $Ca_{1-x}AlSiN_3:Eu_x$ may be synthesized from 5.436 g $Ca_3N_2$ (>98% purity), 4.099 g AlN (99%), 4.732 g $Si_3N_4$ (>98% purity) and 0.176 g $Eu_2O_3$ (99.99% purity). The powders are mixed by planetary ball milling, and fired for 4 hours at 1500° C. in $H_2/N_2$ (5/95%) atmosphere. BSSNE, which is $Ba_{2-x-z}M_xSi_{5-y}Al_yN_{8-y}O_y:Eu_z$ (M=Sr, Ca; $0\leq x\leq1$, $0\leq y\leq4$, $0.0005\leq z\leq0.05$), may be synthesized by carbothermal reduction, which includes mixing 60 g $BaCO_3$, 11.221 g $SrCO_3$ and 1.672 g $Eu_2O_3$ (all 99.99% purity) by planetary ball milling using 2-propanol as dispersing agent. After drying, the mixture is fired in forming gas atmosphere at 1000° C. for 4 hours and 10 g of the thus obtained $Ba_{0.8}Sr_{0.2}O:Eu$ (2%) are mixed with 5.846 g $Si_3N_4$ (>98% purity), 0.056 g AlN (99% purity) and 1.060 g graphite (microcrystal grade). The powders are thoroughly mixed by 20 minutes of planetary ball milling and fired for 4 hours at 1450° C. in a forming gas atmosphere to obtain a powder of $Ba_{2-x-z}M_xSi_{5-y}Al_yN_{8-y}O_y:Eu_z$ (M=Sr, Ca; $0\leq x\leq1$, $0\leq y\leq4$, $0.0005\leq z\leq0.05$). SSONE may be manufactured by mixing 80.36 g $SrCO_3$ (99.99% purity), 20.0 g $SiN_{4/3}$ (>98% purity) and 2.28 g $Eu_2O_3$ (99.99% purity) and firing at 1200° C. for 4 hour in a $N_2/H_2$ (93/7) atmosphere. Such red-emitting phosphor particles may have an average particle diameter between $0.5\lambda$ and $20\lambda$, where $\lambda$ is the wavelength within the device of light emitted by the light emitting region, and a concentration in the transparent material between 0.1 and 95 volume %, more preferably between 10 and 30 volume %.

In one embodiment, particles of a red-emitting phosphor are included in transparent material 36 as scattering particles 45. Light emitting region 31 of semiconductor structure 12 emits blue light. Luminescent ceramic includes a phosphor that emits light in the yellow/green range. Unconverted blue light from light emitting region 31 combines with yellow/green light emitted by luminescent ceramic 30 and red light emitted by red phosphor particles 45 to make composite light that appears white. The amount of red phosphor and the doping level of the red phosphor disposed in transparent material 36 may be selected to produce the desired amount of red emission and the desired amount of scattering. If the amount of red phosphor necessary for the desired amount of red emission does not result in sufficient scattering, non-wavelength-converting particles such as the particles described above may be included in transparent material 36 in addition to the red phosphor particles, in order to reach the desired amount of scattering.

Luminescent ceramic 30 may be formed from any suitable phosphor. Suitable yellow/green emitting phosphors include aluminum garnet phosphors with the general formula $(Lu_{1-x-y-a-b}Y_xGd_y)_3(Al_{1-z}Ga_z)_5O_{12}:Ce_aPr_b$ wherein $0<x<1$, $0<y<1$, $0<z\leq0.1$, $0<a\leq0.2$ and $0<b\leq0.1$, such as $Lu_3Al_5O_{12}:Ce^{3+}$ and $Y_3Al_5O_{12}:Ce^{3+}$; $SrSi_2N_2O_2:Eu^{2+}$; $(Sr_{1-u-v-x}Mg_uCa_vBa_x)(Ga_{2-y-z}Al_yIn_zS_4):EU^{2+}$ including, for example, $SrGa_2S_4:Eu^{2+}$; and $Sr_{1-x}Ba_xSiO_4:Eu^{2+}$. A suitable $Y_3Al_5O_{12}:Ce^{3+}$ ceramic may be produced as follows: 40 g $Y_2O_3$ (99.998%), 32 g $Al_2O_3$ (99.999%), and 3.44 g $CeO_2$ are milled with 1.5 kg high purity alumina balls (2 mm diameter) in isopropanol on a roller bench for 12 hrs. The dried precursor powder is then calcined at 1300° C. for two hours under CO atmosphere. The YAG powder obtained is then deagglomerated with a planet ball mill (agate balls) under ethanol. The ceramic slurry is then slip casted to obtain a ceramic green body after drying. The green bodies are then sintered between graphite plates at 1700° C. for two hours.

Though the above two-phosphor example includes a yellow/green emitting phosphor formed into a luminescent ceramic and a red-emitting phosphor included as scattering particles in a transparent material, the two phosphors may be reversed. For example, one of the red-emitting phosphors described above may be formed into a luminescent ceramic and combined with a transparent material layer including as scattering particles one of the yellow/green emitting phosphors described above.

The transparent material 36 may be, for example, an organic material such as epoxy, acrylic, or silicone, one or more high index inorganic materials, or a sol-gel glass. Such materials may be used as an adhesive to attach luminescent ceramic 30 to semiconductor structure 12, as in the device shown in FIG. 2.

Examples of high index materials include high index optical glasses such Schott glass SF59, Schott glass LaSF 3, Schott glass LaSF N18, and mixtures thereof. These glasses are available from Schott Glass Technologies Incorporated, of Duryea, Pa. Examples of other high index materials include high index chalcogenide glass, such as (Ge,Sb,Ga)(S, Se) chalcogenide glasses, III-V semiconductors including but not limited to GaP, InGaP, GaAs, and GaN, II-VI semiconductors including but not limited to ZnS, ZnSe, ZnTe, CdS, CdSe, and CdTe, group IV semiconductors and compounds including but not limited to Si and Ge, organic semiconductors, metal oxides including but not limited to tungsten oxide, titanium oxide, nickel oxide, zirconium oxide, indium tin oxide, and chromium oxide, metal fluorides including but not limited to magnesium fluoride and calcium fluoride, metals including but not limited to Zn, In, Mg, and Sn, yttrium aluminum garnet (YAG), phosphide compounds, arsenide compounds, antimonide compounds, nitride compounds, high index organic compounds, and mixtures or alloys thereof Gluing with high index inorganic materials is described in more detail in application Ser. No. 09/660,317, filed Sep. 12, 2000, and Ser. No. 09/880,204, filed Jun. 12, 2001, both of which are incorporated herein by reference.

Sol-gel glasses are described in more detail in U.S. Pat. No. 6,642,618, which is incorporated herein by reference. In embodiments where the luminescent ceramic is attached to the device by a sol-gel glass, one or more materials such as oxides of titanium, cerium, lead, gallium, bismuth, cadmium, zinc, barium, or aluminum may be included in the $SiO_2$ sol-gel glass to increase the index of refraction of the glass in order to more closely match the index of the glass with the indices of the luminescent ceramic and the surface of the semiconductor structure to which the luminescent ceramic is attached.

The luminescent ceramics described herein can be textured or molded, ground, machined, hot stamped, or polished into shapes that are desirable, for example, for increased light extraction. For example, a luminescent ceramic may be shaped into a lens such as a dome lens or Fresnel lens, roughened, or textured with a photonic crystal structure, such as a periodic lattice of holes formed in the ceramic. The shaped ceramic layer may be smaller than, the same size as, or larger than the surface to which it is attached.

Figure 3:
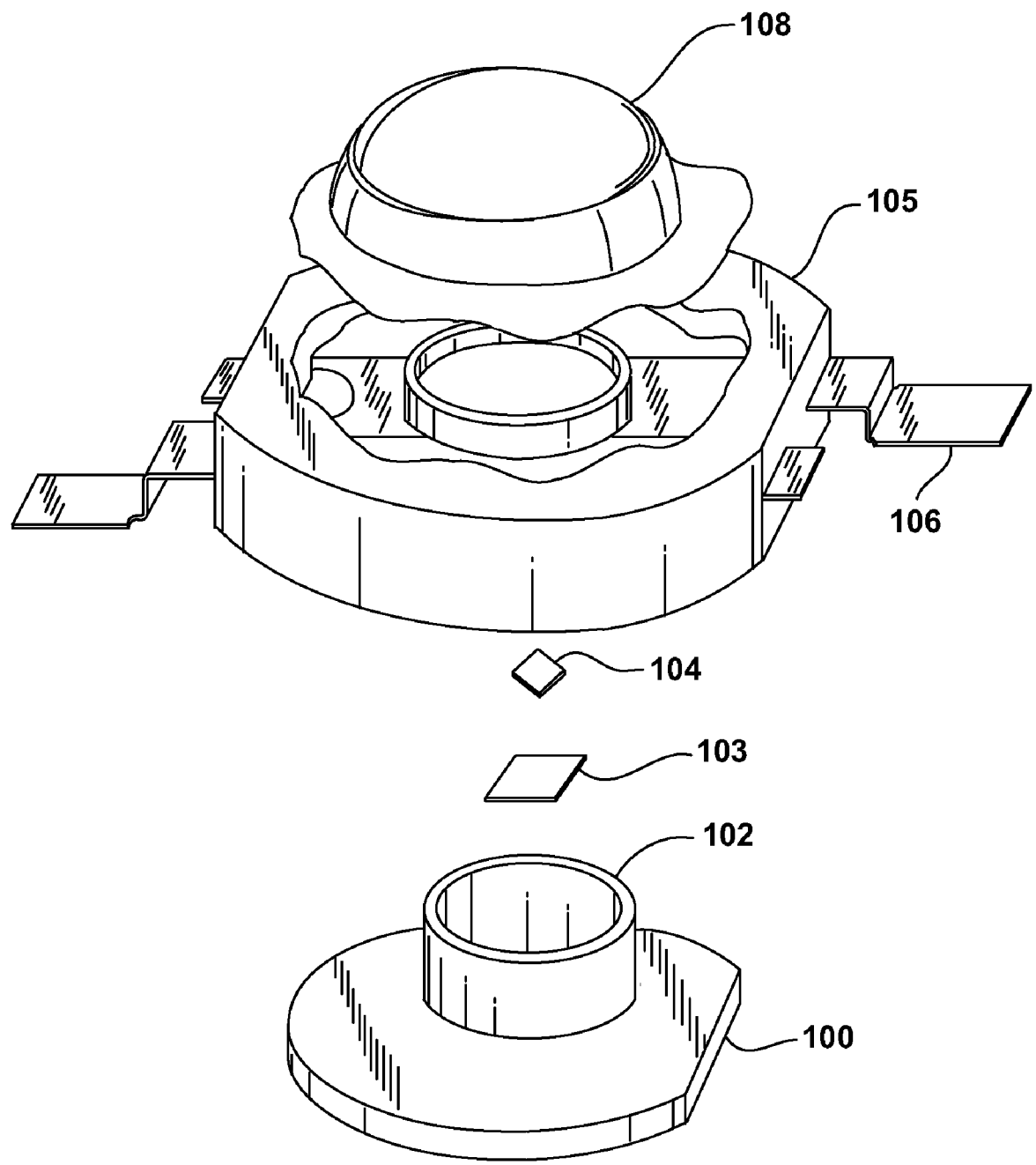
FIG. 3 is an exploded view of a packaged light emitting device.

FIG. 3 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting mount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. For example, though the examples herein refer to III-nitride light emitting diodes, it is to be understood that embodiments of the invention may extend to other light emitting devices, including devices of other materials systems such as III-phosphide and III-arsenide, and other structures such as resonant cavity LEDs, laser diodes, and vertical cavity surface emitting lasers. Therefore, it is not intended that the scope of the invention be limited to the specific embodiments illustrated and described.

What is being claimed is:

1. A device comprising:
    a semiconductor structure comprising a light emitting region disposed between an n-type region and a p-type region;
    a ceramic body comprising a wavelength converting material, the ceramic body being disposed in a path of light emitted by the light emitting region; and
    a layer of transparent material disposed in a path of light emitted by the light emitting region, wherein a plurality of particles configured to scatter light emitted by the light emitting region are disposed in the layer of transparent material.

2. The device of claim 1 wherein the transparent material is disposed between the semiconductor structure and the ceramic body and connects the semiconductor structure to the ceramic body.

3. The device of claim 1 wherein the ceramic body is disposed between the transparent material and the semiconductor structure.

4. The device of claim 1 wherein a thickness of the transparent material is less than 50% a thickness of the ceramic body.

5. The device of claim 1 wherein a difference between an index of refraction of the particles and an index of refraction of the transparent material is at least 0.4.

6. The device of claim 1 wherein the particles are selected from the group of oxides of yttrium, oxides of titanium, oxides of strontium, and oxides of rubidium.

7. The device of claim 1 wherein the particles have an average diameter between 0.5λ and 20λ, where λ is the wavelength of light emitted by the light emitting region within the semiconductor structure.

8. The device of claim 1 wherein the transparent material is selected from the group of silicone, epoxy, and glass.

9. The device of claim 1 wherein the layer of transparent material has a thickness between 0.5 and 50 μm.

10. The device of claim 1 wherein the semiconductor structure comprises a plurality of III-nitride layers.

11. A device comprising:
    a semiconductor structure comprising a light emitting region disposed between an n-type region and a p-type region;
    a ceramic body comprising a first wavelength converting material, the ceramic body being disposed in a path of light emitted by the light emitting region; and
    a layer of transparent material disposed in a path of light emitted by the light emitting region, wherein a plurality of particles of a second wavelength converting material are disposed in the layer of transparent material.

12. The device of claim 11 wherein the transparent material is disposed between the semiconductor structure and the ceramic body and connects the semiconductor structure to the ceramic body.

13. The device of claim 11 wherein the ceramic body is disposed between the transparent material and the semiconductor structure.

14. The device of claim 11 wherein a thickness of the transparent material is less than 50% a thickness of the ceramic body.

15. The device of claim 11 wherein the light emitting region is configured to emit blue light, the first wavelength converting material is configured to absorb blue light and emit yellow or green light, and the second wavelength converting material is configured to absorb blue light and emit red light.

16. The device of claim 11 wherein the first wavelength converting material is selected from the group of $(Lu_{1-x-y-a-b}Y_xGd_y)_3(Al_{1-z}Ga_z)_5O_{12}:Ce_aPr_b$ wherein $0<x<1$, $0<y<1$, $0<z\leq0.1$, $0<a\leq0.2$ and $0<b\leq0.1$; $Lu_3Al_5O_{12}:Ce^{3+}$; $Y_3Al_5O_{12}:Ce^{3+}$; $SrSi_2N_2O_2:Eu^{2+}$; $(Sr_{1-u-v-x}Mg_uCa_vBa_x)(Ga_{2-y-z}Al_yIn_zS_4):Eu^{2+}$; $SrGa_2S_4:Eu^{2+}$; and $Sr_{1-x}Ba_xSiO_4:Eu^{2+}$.

17. The device of claim 11 wherein the second wavelength converting material is selected from the group of $(Ca_{1-x}Sr_x)S:Eu^{2+}$ wherein $0<x\leq1$; $CaS:Eu^{2+}$; $SrS:Eu^{2+}$; $(Sr_{1-x-y}Ba_xCa_y)_{2-z}Si_{5-a}Al_aN_{8-a}O_a:Eu_z^{2+}$ wherein $0\leq a<5$, $0<x\leq1$, $0\leq y\leq1$, and $0<z\leq1$; $Sr_2Si_5N_8:Eu^{2+}$; $Ca_{0.99}AlSiN_3:Eu_{0.01}$; $Ba_{2-x-z}M_xSi_{5-y}Al_yN_{8-y}O_y:Eu_z$ (M=Sr, Ca; $0\leq x\leq1$, $0\leq y\leq4$, $0.0005\leq z\leq0.05$); and $Sr_{1-x}Si_2O_2N_2:Eu^{2+}$.

18. The device of claim 11 further comprising a plurality of non-wavelength-converting particles disposed in the layer of transparent material.

19. The device of claim 11 wherein the transparent material is selected from the group of silicone, epoxy, and glass.

20. The device of claim 11 wherein the transparent material has a thickness between 0.5 and 50 μm.

21. The device of claim 11 wherein the semiconductor structure comprises a plurality of III-nitride layers.

22. The device of claim 11 further comprising:
    n- and p-contacts electrically connected to the n- and p-type regions; and
    a cover disposed over the light emitting region.

* * * * *